United States Patent
Lebby et al.

[11] Patent Number: 6,022,760
[45] Date of Patent: Feb. 8, 2000

[54] INTEGRATED ELECTRO-OPTICAL PACKAGE AND METHOD OF FABRICATION

[75] Inventors: Michael S. Lebby, Apache Junction; Wenbin Jiang, Phoenix; Karen E. Jachimowicz, Laveen, all of Ariz.

[73] Assignee: Motorola, Inc., Schaumburg, Ill.

[21] Appl. No.: 09/118,879

[22] Filed: Jul. 20, 1998

Related U.S. Application Data

[62] Division of application No. 08/902,689, Jul. 30, 1997, Pat. No. 5,821,571.

[51] Int. Cl.[7] .......................... H01L 21/44; H01L 21/48; H01L 21/50
[52] U.S. Cl. .......................... 438/123; 438/106; 438/121; 438/116
[58] Field of Search .................................. 438/123, 106, 438/121, 116

[56] References Cited

U.S. PATENT DOCUMENTS 5,283,447  2/1994  Olbright et al. .
5,500,540  3/1996  Jewell et al. .
5,606,572  2/1997  Swirhun et al. .
5,837,561  11/1998  Kish, Jr. et al. .

Primary Examiner—Kevin M. Picardat
Assistant Examiner—D. Mark Collins
Attorney, Agent, or Firm—Eugene A. Parsons; William E. Koch

[57] ABSTRACT

An integrated electro-optical package including a dual sided opto-electronic device, composed of a substrate with an array of light emitting devices (LEDs) formed on a first major surface thereof, and at least one vertical cavity surface emitting laser formed on an opposed second major surface of the substrate. A mounting structure formed so as to allow for the mounting of the dual sided opto-electronic device on the interior major surfaces, and further having electrical conductors for cooperating with the LEDs and VCSEL of the opto-electronic device. A driver substrate having electrical connections for interfacing with the mounting structure and the dual sided opto-electronic device. A plurality of driver circuits connected to the mounting structure and dual sided opto-electronic device through connection pads formed on the driver substrate.

4 Claims, 4 Drawing Sheets

INTEGRATED ELECTRO-OPTICAL PACKAGE AND METHOD OF FABRICATION

This application is a divisional of 08/902,689 filed Jul. 30, 1997 which is U.S. Pat. No. 5,821,571.

FIELD OF THE INVENTION

The present invention pertains to packages containing electrical and optical components connected in cooperation and more specifically to a package for electrically connecting optical components and driver circuits in electrical circuitry.

BACKGROUND OF THE INVENTION

Portable electronic transceivers, such as cellular and cordless telephones, pagers and the like, are becoming increasingly popular. In some instances it is possible to send complete messages, including alpha-numerics and/or graphics by way of novel devices. Thus, complete messages can be sent to specific recipients by way of a pager, or the like, and upon receiving the complete message, the recipient may wish to transmit a response. In these instances it is desirable to have an electronic transmitting device of some sort included within the portable device. In other instances it may be desirable to share with others the message received, and/or simply receive and/or transmit communication data to additional electronic devices. The problem is that it is difficult and unwieldy to carry various communication transceivers and electronic devices, e.g. telephones and/or two-way radios, as well as pagers, remote controls and other devices.

In many instances it is desirable to provide a visual display on a communication transceiver to supply the operator with a visual message or graphical image. The problem is that the visual displays on prior art communications receivers are extremely limited in size, require relatively high electrical power as well as a great amount of area to be sufficiently large to produce a useful display, and in most instances are intended to be viewed by the operator of the device. In addition, and as previously stated, at times it is desirable for the image transmitted to the electronic transceiver to be viewable by more than just the user of the device. It is in this instance that a display capable of being viewed by many individuals is desired, such as a projection display.

In the prior art, it is common to provide visual displays utilizing liquid crystal displays, directly viewed light emitting diodes, etc. These produce very large and cumbersome displays that greatly increase the size of the transceiver and require relatively large amounts of power. Further, such displays, when used on portable electronic devices, such as pagers, cellular telephones, or the like, greatly limit the amount of message that can be received.

In one instance, the prior art includes a scanning mirror to produce a visual display but again this requires relatively large amounts of power and is very complicated and sensitive to shock. Also, the scanning mirror causes vibration in the unit that substantially reduces visual comfort and acceptability.

One way to alleviate the problem of size in visual displays and the inclusion of a projection display and/or data communication link into portable devices of this type is to utilize an electro-optical package incorporating a dual light source, namely one containing both LED light sources and vertical cavity surface emitting laser (VCSELs) light sources. By incorporating these two types of light sources within a single package, a visual display, such as a miniature virtual display generated by the LEDs and a projection display and/or data communication link generated by the VCSELs is possible.

Accordingly, a portable transceiver device that could receive communications and/or data, viewable through a visual display, such as a miniature virtual display, and receive and/or transmit data through a data interface port, such as an infra-red or visible data transmission interface and/or visible laser projection display would be highly advantageous. In achieving the design of such a transceiver, it would be advantageous to fabricate a dual sided light source that has formed thereon a common substrate, composed of a single semiconductor wafer, or a plurality of bonded semiconductor wafers, a plurality of visible LEDs and at least one vertical cavity surface emitting laser (VCSEL) fabricated to emit light in a visible range and/or an infra-red range. Therefore, desired is an integrated electro-optical package which has contained therein, a dual sided display chip mounted between either a pair of optically transparent mounting structures or mounted within a molded plastic base structure having defined therein central openings or windows formed on opposed surfaces of the structure, both types of mounting structures incorporating a means for interfacing with a printed circuit board and drive circuits, such as through, patterned electrical interconnects, connection/mounting pads, embedded lead frames and/or plated through-hole vias and optical elements.

Thus, there is a need for interconnect and packaging structures and techniques in which LED arrays, vertical cavity surface emitting lasers (VCSELs), optical elements and electronic circuitry can be conveniently incorporated There is also a need for interconnect and packaging structures and techniques which can substantially reduce the limitation on size of the electro-optical package.

Therefore, it is a purpose of the present invention to provide a new and improved electro-optical package that includes a dual sided light source, or display chip.

It is a purpose of the present invention to provide for an integrated electro-optical package which is substantially smaller than previous integrated packages.

It is a purpose of the present invention to provide for an integrated electro-optical package in which an LED array, and at least one vertical cavity surface emitting laser (VCSEL) can be formed as a dual sided opto-electronic device, including electrical interconnects.

It is also a purpose of this invention to provide a package incorporating a novel method of fabricating a two-dimensional LED array and at least one vertical cavity surface emitting laser (VCSEL) on a single substrate, composed of one or more semiconductor wafers, thereby forming a dual sided display chip, having formed therein electrical interconnects, that in combination with optical elements, provides for high density information image manifestation apparatus applications, data communications transmission link applications, and projection display applications.

SUMMARY OF THE INVENTION

The above problems and others are substantially solved and the above purposes and others are realized in an integrated electro-optical package including a dual sided opto-electronic device, formed of an substrate, composed of one or more semiconductor wafers, having a major surface with an array of visible light emitting devices (LEDs) formed on the major surface at a central portion thereof and cooperating to generate a complete image, and at least one vertical cavity surface emitting laser (VCSEL) formed on an opposed surface of the substrate capable of emitting visible and/or infra-red light. The dual sided opto-electronic device thereby emitting light in opposed directions.

Disclosed is the dual sided opto-electronic device, mounted between optically transparent substrates, or between a molded base, formed of plastic or the like, and having defined therein a central opening or optically transparent portion through which the emitted light passes in opposed directions. Additionally, the electro-optical package in one embodiment includes an optical element being formed within, or positioned on top of the optically clear portion. There is provided a means for interfacing with a printed circuit board, having mounted thereon at least one driver circuit. The two-dimensional LED array for image manifestation apparatus applications is composed of a plurality of LEDs (one or more of which form a pixel) arranged in rows and columns to form a two-dimensional X-Y addressing pattern. The at least one vertical cavity surface emitting laser (VCSEL) is formed on an opposed surface of the substrate either as a single emitting VCSEL or an array of VCSELs arranged in rows and columns to form a two-dimensional X-Y addressing pattern, similar to the LED array.

A mounting structure is formed as two separate optically transparent substrates, or as a molded component. The mounting structure has a plurality of electrical conductors formed therein or positioned thereon as electrical traces, each extending from a plurality of connection/mounting pads formed adjacent an edge of the array of LEDs and the at least one VCSEL, to a plurality of means for electrical connection, e.g., connection/mounting pads, interfaced with a surface mounted or embedded leadframe, and/or plated through-hole vias, formed about the periphery of the base. In the instance where a molded mounting structure is utilized, the mounting structure is formed of a molded opaque or optically transparent plastic, or some other suitable material, defining a monolithic, centrally located optically transparent portion or a window opening on a first major surface and on a second major surface. In the instance where a window opening is formed in the mounting structure, and subsequent to the molding of the mounting structure, a lens is formed within one of the windows through injection molding or in the alternative an optically transparent substrate can be injection molded into the window opening, thereafter having a refractive or diffractive surface stamped or pressed onto its upper major surface, thereby providing for initial correction/magnification of light emitted by the plurality of LEDs. A plurality of connection/mounting pads and electrical conductors are formed within the molded base.

The dual sided opto-electronic device is mounted between the interior major surfaces of the optically transparent substrates or molded base component, using flip chip bump bonding known in the art.

There is provided a driver substrate, such as a standard PCB board, having a plurality of conductors formed therein, in electrical contact with the means for electrical connection, e.g., the connection/mounting pads formed about the periphery of the mounting structure. A plurality of driver and controller circuits are mounted on the driver substrate and have data input terminals and further have control signal output terminals connected to the light emitting devices and the at least one VCSEL for activating the light emitting devices and the at least one VCSEL to generate images and/or light in accordance with data signals applied to the data input terminals utilizing patterned electrical interconnects, connection/mounting pads, mounting pins, embedded leadframes and/or plated through hole vias.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

DESCRIPTION OF THE PREFERRED EMBODIMENT

Figure 1:
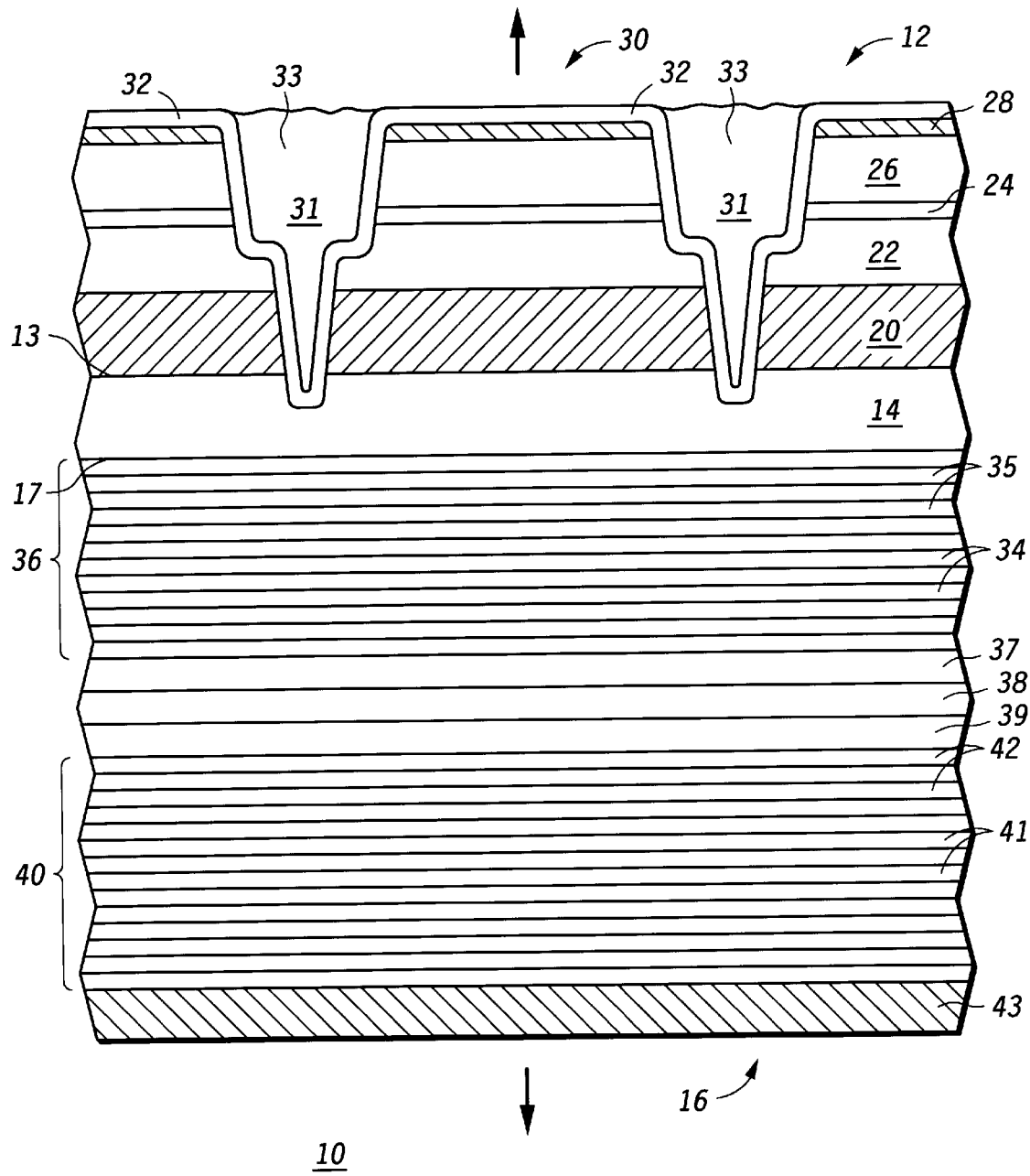
FIG. 1 is a greatly enlarged sectional view of the dual sided opto-electronic device composed of a partial array of light emitting devices formed on a first major surface of a substrate and a vertical cavity surface emitting laser (VCSEL) formed on an opposed second major surface of the substrate.

During the course of this description, like numbers are used to identify like elements according to the different figures that illustrate the invention. It should be understood that a wide variety of light emitting devices, including liquid crystal displays (LCDs), light emitting diodes, vertical cavity surface emitting lasers (VCSELs), etc. can be utilized for the array of light emitting devices (LEDs) of the present invention. Referring specifically to FIG. 1, illustrated is a greatly enlarged sectional view of a dual sided opto-electronic device 10 composed of a partial array of light emitting devices 12 formed on a first major surface 13 of a substrate 14 and a vertical cavity surface emitting laser (VCSEL) 16 formed on an opposed second major surface 17 of substrate 14. For simplicity of illustration, only a representative portion of substrate 14 has been completed. Substrate 14 is illustrated in FIG. 1 as being composed of one single substrate or wafer element. It should be understood that in the alternative, substrate 14 can be composed of two separate semiconductor wafers, such as two gallium arsenide (GaAs) wafers or a single gallium arsenide (GaAs) wafer and a sapphire substrate member, that are bonded or fused together, back to back, forming an effective single substrate. The bonding of the wafers would typically be completed subsequent to fabrication of the light emitting devices 12 on a first wafer and the VCSEL(s) 16 on a second wafer.

As illustrated in FIG. 1, substrate 14 has formed on uppermost major surface 13 the plurality of light emitting devices 12. It should be understood that the light emitting devices (LEDs) 12 utilized in the present invention, include a wide variety of light emitting devices, including liquid crystal displays (LCDs), light emitting diodes (LEDs), both organic and inorganic, electroluminescent devices, and lasers, such as vertical cavity surface emitting lasers (VCSELs), etc., but the term "light emitting devices" will be utilized throughout this description for simplicity. In this embodiment, each of the light emitting devices 12, and the vertical cavity surface emitting lasers (VCSELs) 16, formed on substrate 14, defines a pixel, with light emitting devices 12, and when utilizing a plurality of VCSELs 16, are positioned in rows and columns and cooperating to generate a complete image, and/or emit light, when activated, at a central portion of first major surface 13 and opposed second major surface 17.

Referring specifically to the structure and fabrication of the array of LEDs 12, illustrated is a plurality of layers of material formed on first major surface 13 of substrate 14 including at least a conductive layer of material supported by major surface 13 of substrate 14, a first carrier confinement layer on the conductive layer, an active layer on the first carrier confinement layer, and a second carrier confinement layer on the active layer. The plurality of layers of material are separated into a plurality of isolated light emitting devices positioned in a matrix of rows and columns with the conductive layer connecting a first electrode of each diode in a column to a first electrode of each other diode in the column. A plurality of row conductors, one for each row, connecting a second electrode of each diode in a row to a second electrode of each other diode in the row and a plurality of column conductors, one for each column, are connected, one each, to the conductive layer adjacent an end of each column.

More specifically, the structure includes substrate 14 on which is positioned, in the following order, a conductive layer 20, a first carrier confinement layer 22, an active layer 24, a second carrier confinement layer 26 and a conductive cap layer 28. It should be understood that other applications could be used for the fabrication of LEDs 12, such as implanting, etc., and that the particular fabrication technique described herein is merely to represent one technique in the formation of LEDs 12.

In a specific embodiment, substrate 14 is formed of undoped gallium arsenide (GaAs) so that substrate 14 is a semi-insulating semiconductor. Conductive layer 20 is a layer of GaAs epitaxially grown on the surface of substrate 14 and is heavily doped ($10^{18}$ or greater) with a dopant such as selenium, silicon, etc. to make it a relatively good N+-type conductor. In this specific example, conductive layer 20 is grown to a thickness in the range of approximately 1000–10,000 angstroms. First carrier confinement layer 22 is a layer of indium-gallium-aluminum phosphide epitaxially grown on the surface of conductive layer 20 and doped ($10^{17}$–$10^{18}$) with silicon for N-type semiconductivity. In this specific embodiment, carrier confinement layer 22 is grown to a thickness in the range of approximately 1000–8000 angstroms. Active layer 24 is an undoped layer of indium-gallium-aluminum phosphide epitaxially grown on the surface of carrier confinement layer 22 to a thickness in the range of approximately 100–2000 angstroms. Second carrier onfinement layer 26 is a layer of indium-gallium-aluminum hosphide epitaxially grown on the surface of active layer 4 and doped ($10^{16}$–$10^{18}$) with zinc for P-type semiconductivity. In this specific embodiment, carrier confinement layer 26 is grown to a thickness in the range of approximately 1000–8000 angstroms. A conductive cap layer 28 is epitaxially grown on the surface of carrier confinement layer 26 to a thickness in the range of approximately 100–1000 angstroms and is heavily doped ($10^{19}$) with zinc to make it a good P+-type conductor. The molecular fraction of aluminum in carrier confinement layers 22 and 26 is given as $In_y(Al_xGa_{1-x})_{1-y}P$, where x is in the range of approximately 0.7–1.0 and y is in the range of 0.4 to 0.7. For simplicity of fabrication in the specific example disclosed, layers 20 through 28 are epitaxially grown as blanket layers over the entire substrate 14 but it will be understood that other methods, including masking and selective growth or selective etching, can be utilized to provide the area necessary for the following steps.

Portions of cap layer 28, carrier confinement layer 26, active layer 24 and carrier confinement layer 22 have been etched to form, or separate, mesas organized into a two dimensional array or matrix of rows and columns (only one full mesa 30 is illustrated for convenience). The upper surface of each mesa 30 in the array of light emitting devices 12 defines a light emitting area for a light emitting diode.

During fabrication, a column isolation step is performed by etching trenches 31 through cap layer 28, carrier confinement layer 26, active layer 24, carrier confinement layer 22, conductive layer 20 and partially into substrate 14. Trenches 31 extend the entire length of each column so that conductive layer 20 is separated into a plurality of columns, each column of conductive layer 20 being associated with only one column of mesas 30 and each column of mesas 30 being electrically separated from each other column of mesas 30 by a trench 31.

In a similar fashion, mesas 30 are defined by etching a trench (not shown) through cap layer 28, carrier confinement layer 26, active layer 24 and partially into carrier confinement layer 22 between each row in the array. Each trench extends the length of a row and prevents cross-talk between adjacent light emitting devices in a column while allowing the lower terminal of each light emitting device in a column to be connected to the lower terminal of each other light emitting device in the same column.

A layer 32 of dielectric material, which in this specific example is $Si_3N_4$, is then deposited over the wafer to provide passivation of the etched surfaces and isolation between the metal layers. The wafer surface is replanarized with a layer 33 of polyimide. Vias are then etched in layer 32 and layer 33 on the top of each of the mesas 30 to provide access to conductive cap layer 28. P-contact metal (not shown) is applied to the exposed surface of conductive cap layer 28 using standard lift-off techniques to ohmic contacts, with the upper terminal of each light emitting device in a row and to form row current buses therebetween.

It should be understood that the array of LEDs 12 is positioned in rows and columns to define all pixels of a complete image generated by the LEDs 12 and is operably connected to a plurality of connection pads (discussed presently) adjacent outer edges of the substrate 14. Throughout this description references to rows and columns are made for simplicity of the disclosure but it will be understood by those skilled in the art that these terms are completely interchangeable since rows and columns of a matrix generally depend upon a physical orientation and are changed, for example, by simply rotating the device 90°.

Referring specifically to the structure and fabrication of vertical cavity surface emitting laser (VCSEL) 16, illustrated is a plurality of layers of material formed on opposed second major surface 17 of substrate 14. It should be understood that this is just a representation of one VCSEL structure and there can be many of these structures located on substrate 14 to form arrays. It should be further understood that other applications could be used for the fabrication of VCSEL 16 of this invention such as etching of trenches or the like. In general, VCSEL 16 is formed by depositing a plurality of layers on a substrate and then etching the layers down to the substrate to form the VCSEL. Further information on the formation of VCSELs according to this method can be found in U.S. Pat. No. 5,034,092, entitled "PLASMA ETCHING OF SEMICONDUCTOR SUBSTRATES", issued Jul. 23, 1991, assigned to the same assignee and included herein by this reference.

Substrate 14, as previously stated, is made of undoped gallium arsenide. Gallium arsenide is illustrated as used for substrate 14 to facilitate epitaxial growth of multiple layers of high and low aluminum concentrations of gallium arsenide 34 and aluminum arsenide 35, such as $Al_{0.85}GaAs$ and $Al_{0.15}GaAs$. It should be understood that other semiconductor substrates could be used as well.

Epitaxial deposition of multiple alternate layers of different compositions is accomplished by well known techniques in the art such as MBE, MOCVD, or the like. These techniques enable epitaxial deposition of relatively thin and thick layers of a variety of materials such as gallium arsenide, aluminum gallium arsenide, aluminum arsenide, silicon or the like. Fabrication of VCSEL devices use epitaxial deposition extensively to produce the multitude of layers of different materials which make up the device. It should be understood that VCSEL 16 can be fabricated to emit visible and/or infra-red light. More specifically, VCSEL 16 can be fabricated to emit light in a visible range of blue, green, red, when utilizing active layers of indium gallium nitride (InGaN), or utilizing indium gallium aluminum phosphide (InGaAlP), to achieve light in a red range. In addition, VCSEL 16 can be fabricated to emit infra-red light, utilizing gallium arsenide (GaAs), indium gallium arsenide (InGaAs), and/or indium gallium arsenide phosphide (InGaAsP), to emit light in an infra-red range. Again, It should be understood that electro-optical package 10 is fabricated having a single VCSEL 16 formed thereon or a plurality of VCSELs 16 formed thereon, defining an array of VCSELs 16.

By way of example, VCSEL 16 is fabricated by epitaxial deposition of alternating layers or films of silicon doped aluminum gallium arsenide (AlGaAs) 34, with a low fraction aluminum (Al), and aluminum gallium arsenide (AlGaAs) 35, with a high fraction aluminum (Al), more specifically silicon doped $Al_{0.15}Ga_{0.85}As$ and $Al_{0.85}Ga_{0.15}As$, on opposed second major surface 17 of substrate 14. Deposition of alternating layers of doped aluminum gallium arsenide 34 and 35 form a first set of reflectors or mirror stacks 36 for the VCSEL device. Thickness of alternating layers of aluminum gallium arsenide 34 and aluminum gallium arsenide 35 are set at approximately one quarter wavelength of the frequency that the device is designed to operate at. Generally, efficiency of a VCSEL is increased by increasing the number of alternating layers in the reflector regions.

Cladding region 37 is epitaxially deposited on multiple layers of aluminum gallium arsenide 34 and 35. Cladding region 37 typically has two parts which are not shown to avoid overcrowding of the figure. First a silicon doped aluminum gallium arsenide layer is deposited on the first reflector stack. Second, an undoped aluminum gallium arsenide layer is deposited on the silicon doped aluminum gallium arsenide layer.

Active region 38 is epitaxially deposited on cladding region 37. Active region 38 is commonly made of two barrier regions (not shown) which are deposited on either side of a center strained quantum well region. The two barrier regions are made of approximately 100 angstroms each of undoped aluminum gallium arsenide The strained quantum well region is generally made of undoped gallium arsenide with an approximate thickness of 80 angstroms.

A second cladding region 39 is epitaxially deposited on active region 38. Cladding region 39 is commonly made of two parts (not shown). First, undoped aluminum gallium arsenide is deposited on active region 38. Second, carbon doped aluminum gallium arsenide is deposited on the undoped aluminum gallium arsenide. It should be understood that in the alternative p-dopants, such as beryllium and zinc can also be used.

A second reflector or mirror stack 40 is epitaxially deposited on second cladding region 39. The second reflector region is composed of alternating layers of carbon doped aluminum gallium arsenide 41, with a low fraction aluminum, and aluminum gallium arsenide 42, with a high fraction of aluminum, more specifically, carbon doped $Al_{0.85}Ga_{0.15}As$ and $Al_{0.15}Ga_{0.85}As$. Generally, thickness of the last alternating layer is approximately one half wave length instead of one quarter wave length as is used for the other alternating layers.

A metal layer 43, typically made of titanium, platinum, gold, and nickel is deposited on the last of the alternating layers 34 and 35. Metal layer 43 is fabricated so that geometric patterns are formed by using a common liftoff process. It should be understood that other masking structures and methods could be used to fabricate geometric patterns such as photoresist, dielectrics, or the like. Metal layer 43 once patterned serves as an etch mask for etching the exposed alternating layers.

After epitaxially depositing a multitude of layers on substrate 14, the VCSEL structure is defined with metal layer 43, and is etched. After the etching is complete, a VCSEL structure, as illustrated, is obtained, capable of emitting light in a range dependent upon the particular materials utilized in the fabrication of VCSEL(s) 16, as previously described.

An alternative method of fabricating VCSEL(s) 16 is disclosed in U.S. Pat. No. 5,258,316, entitled "PATTERNED MIRROR VERTICAL CAVITY SURFACE EMITTING LASER", issued Nov. 2, 1993, assigned to the same assignee, and included herein by this reference. Disclosed is the formation of a VCSEL(s) by defining an operating area in the second reflector or mirror region 40 to form a trench surrounding the operating area and extending the depth of the trench sufficiently to reduce reflectivity below an amount required to support lasing in a volume of the laser between the trench and the active layer.

While specific sequences of steps have been disclosed in the fabrication of dual sided opto-electronic device 10, it will be understood by those skilled in the art that many of the steps are interchangeable, and the exact sequence utilized depends upon the specific methods applied, including chemicals, temperatures, etc. In addition, it should be understood that during the fabrication of dual sided opto-electronic device 10, either epitaxial layer growth sequence can be grown first, but preferably the array of light emitting devices 12 is formed first. As previously stated, the growth technique for both sides of dual sided opto-electronic device 10 will most likely be MOCVD, although other techniques such as CBE, MBE, or MOMBE could be utilized. The key to the fabrication process of dual sided opto-electronic device 10 is the protection of either epitaxial structure on the underneath of the wafer. Accordingly, a thick layer of gallium arsenide (GaAs) should be utilized as a protection layer, to allow for typical processing scratches and markings as the opposed epitaxial structure is fabricated. It should be understood that neither the sequence disclosed nor claimed is intended to in any way limit the present invention to a specific sequence of steps for the formation of dual sided opto-electronic device 10.

Figure 2:
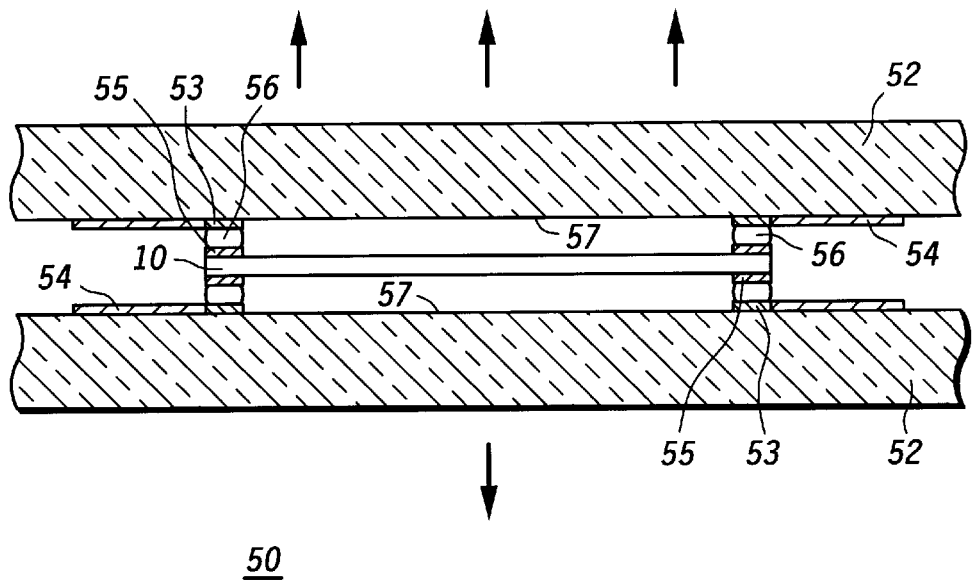
FIG. 2 is a simplified cross-sectional view of an electro-optical package, portions thereof broken away, according to the present invention.
Figure 3:
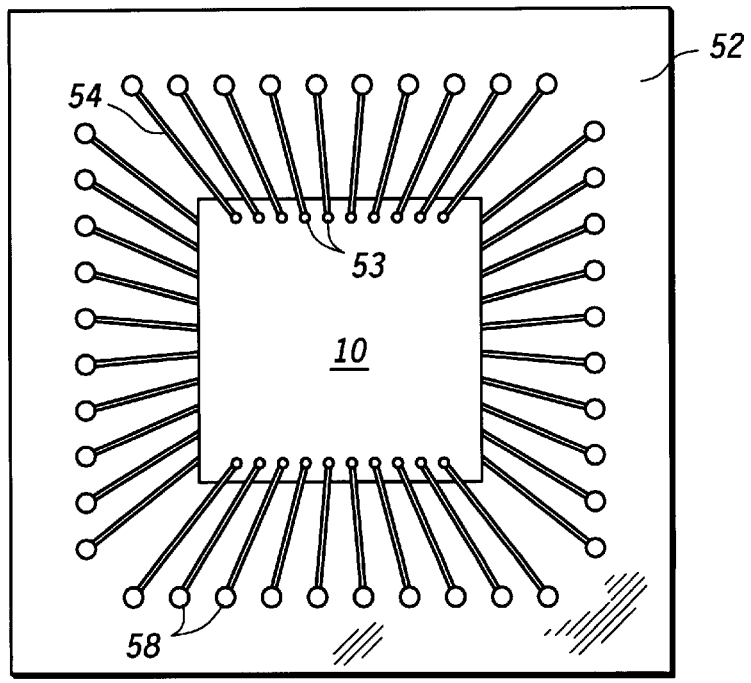
FIG. 3 is an enlarged view in top plan of dual sided LED/VCSEL display chip mounted between two optically transparent mounting structures, including electrical connections.

Referring now to FIGS. 2–6, disclosed is the incorporation of dual sided opto-electronic device 10, described above, into a complete electro-optical package 50. Specifically referring to FIGS. 2 and 3, illustrated in simplified cross-sectional view is electro-optical package 50, portions thereof broken away, and an enlarged view in top plan of the dual sided opto-electronic device 10 mounted between two optically transparent mounting structures 52, including electrical connections. Electro-optical package 50 is generally composed of dual sided opto-electronic device 10 and mounting structure 52. Mounting structure 52 in this particular embodiment is formed as two substantially planar components of optically transparent glass or the like and have formed thereon a plurality of connection/mounting pads 53 and a plurality of electrical conductors 54, thereby providing for an electrical interface with a plurality of connection pads 55 formed on dual sided opto-electronic device 10 when dual sided opto-electronic device 10 is properly registered on a plurality of interior surfaces of mounting structures 52, utilizing bumps 56 and standard bump bonding techniques.

Disclosed in the preferred embodiment are the plurality of electrical conductors 54, each extending from connection/mounting pad 53 on a plurality of interior major surfaces 57 of optically transparent mounting structure 52, adjacent an edge of a central portion, substantially coextensive with a complete image generated by the LEDs 12 and at least one VCSEL 16 of dual sided opto-electronic device 10, to a connection/mounting pad 58, positioned about the outer periphery of mounting structure 52, to electrically connect the rows and columns of light emitting devices 12 and VCSELs 16 to connection/mounting pads 58 positioned about the outer periphery. It is additionally disclosed to use surface mounted or embedded leadframes, and or plated through-hole vias to form the required means for electrically connecting the components together.

By fanning out electrical conductors 54, connection/mounting pads 58 can be constructed large enough to provide easy electrical contact thereto. Electrical conductors 54 and connection/mounting pads 53 and 58 can be formed from surface embedded copper leads, solder paste screen print interconnects, gold plated interconnects or metal evaporation. In addition, sol-gel technology, incorporating the usual steps of printing, patterning, and fusing can be utilized, as well as standard thin film metallization in which layers of metal are deposited by, for example, sputtering. In a typical metallization system, a first layer of chromium is applied by sputtering to operate as an adhesive layer on mounting structures 52. A second layer of copper is applied over the chromium to provide the desired electrical conduction and a layer of gold is applied over the copper to provide a barrier and adhesive layer for further connections. It should be understood that the metallization can be either an additive or subtractive method with the patterning and etching being performed by any of the various methods well known in the art to provide the desired final structure.

Connection/mounting pads 58 are intended for electrical interface with an external driver board, such as a standard FR4 printed circuit board. It should be understood that a plurality of driver/control circuits are mounted on the driver board utilizing standard wire bonding or bump bonding techniques. During operation, signals received by the driver/control circuits activate the plurality of LEDs 12 and at least one VCSEL 16 to generate an image or signal in response thereto. It should be understood that light is emitted by dual sided opto-electronic device 10 in opposed directions as indicated by the directional arrows in FIGS. 2, 4, 5, and 6.

Figure 4:
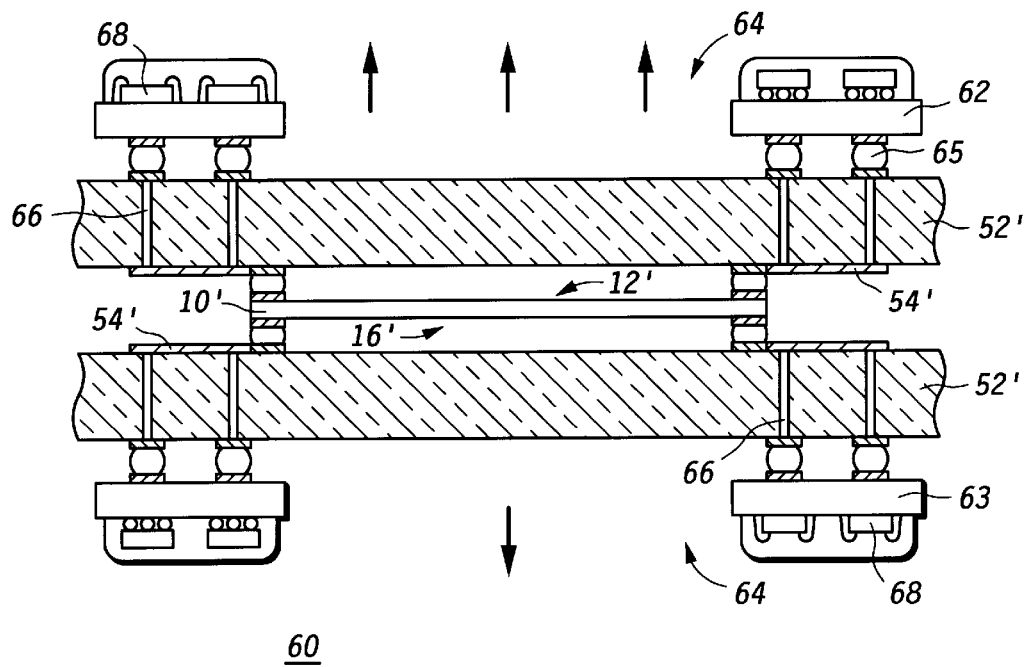
FIG. 4 is a simplified cross-sectional view of another embodiment of a complete electro-optical package of the present invention including two plastic mounting structures, portions thereof broken away.
Figure 5:
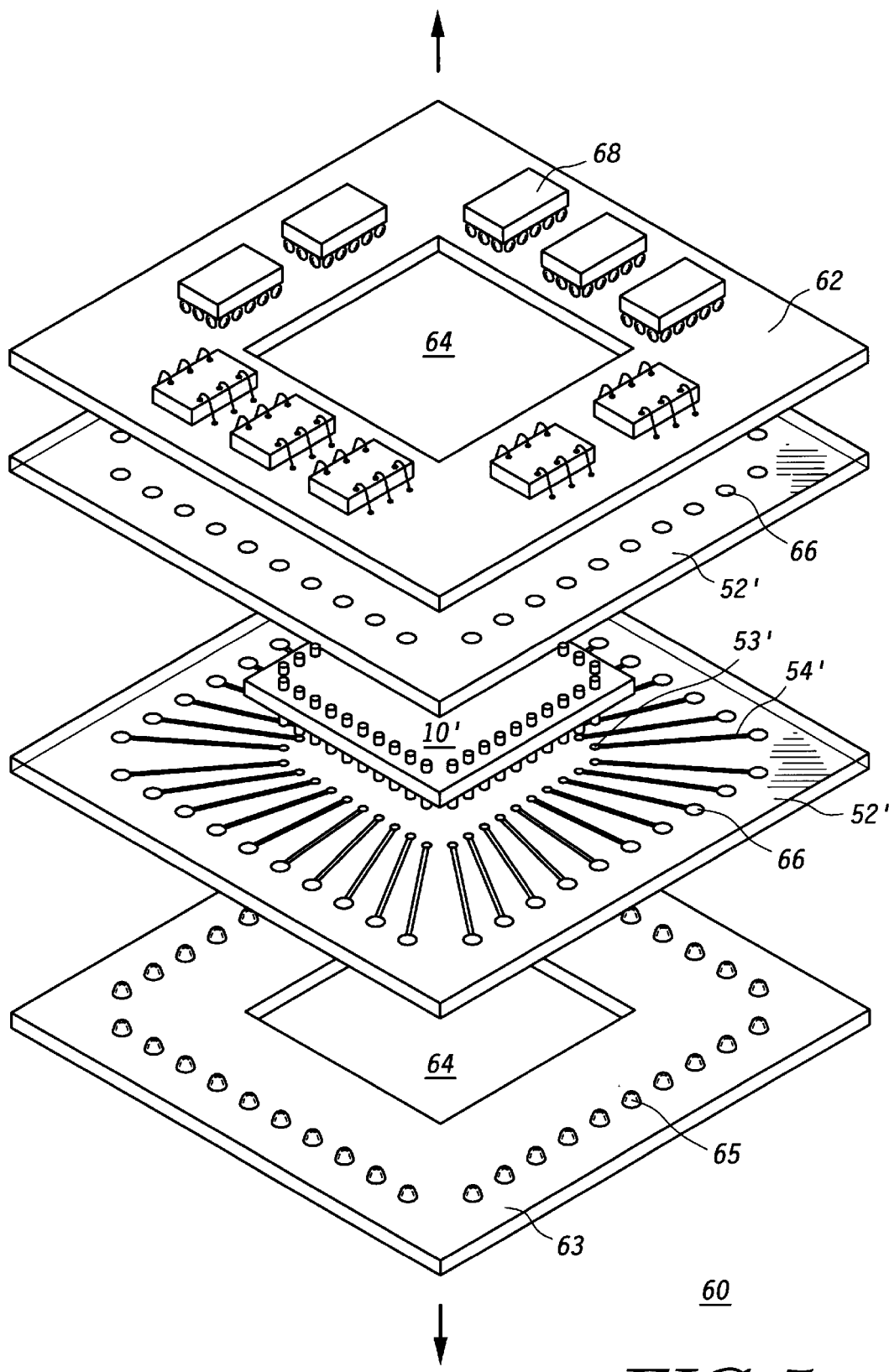
FIG. 5 is an exploded view in perspective illustrating the relative positions of the components of the electro-optical package of FIG. 4 in accordance with the present invention.

An enlarged view similar to that of FIG. 2, of the dual sided opto-electronic device 10 assembled into another embodiment of a complete electro-optical package 60 is illustrated in FIG. 4. Referring specifically to FIG. 5, shown in perspective is the completely integrated electro-optical package 60 of the present invention. In the embodiment of FIGS. 4 and 5, portions that are similar to those described in conjunction with FIGS. 2 and 3 are designated with similar numbers having a prime added to indicate the different embodiment. In this embodiment there is provided a first driver substrate 62 and a second driver substrate 63, each formed having a central opening 64 therethrough, substantially coextensive with the complete image generated by the array of LEDs 12' and the light emitted by the at least one vertical cavity surface emitting laser (VCSEL) 16'. The formation of central openings 64 allows for driver substrates 62 and 63 to be mounted on sides of mounting structures 52' opposite the mountings of dual sided opto-electronic device 10'. Driver substrates 62 and 63 are mounted to mounting structures 52' utilizing s plurality of standard electrically conductive bumps 65 and bump bonding techniques. The complete image generated by array of light emitting devices 12' and the infra-red or visible light emitted by the at least one VCSEL 16 of dual sided opto-electronic device 10' each passes through optically transparent mounting structures 52' and through central openings 64 in driver substrate 62 and 63. In this particular embodiment, mounting structure 52' is formed of two substantially planar molded optically transparent plastic components, or the like and have additionally formed therein a plurality of electrical connections, illustrated here as a plurality of plated through-hole vias 66 and/or a plurality of embedded leadframes (not shown) to electrically connect dual sided opto-electronic device 10' with a plurality of driver and control circuits 68.

Figure 6:
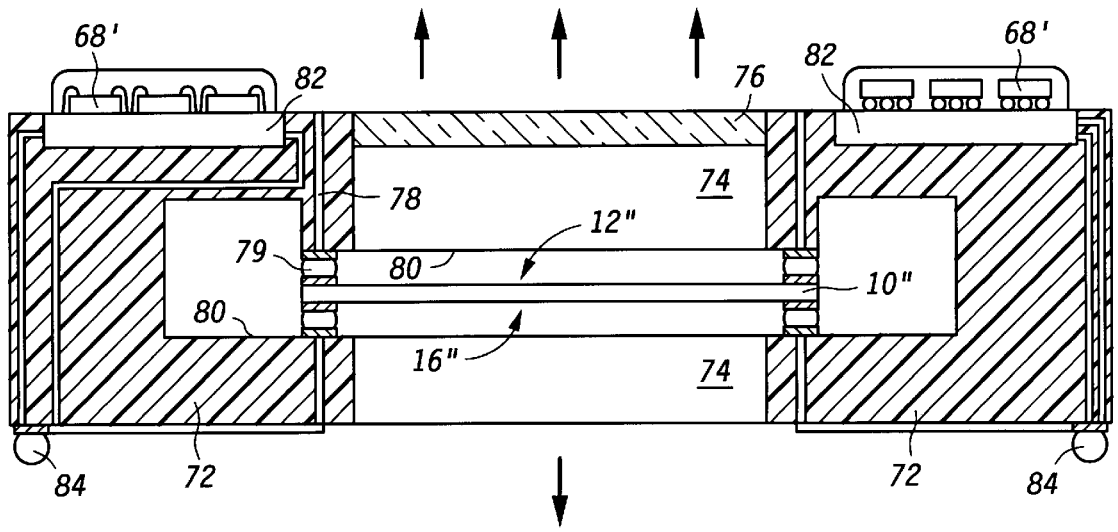
FIG. 6 simplified cross-sectional view of another embodiment of a complete electro-optical package of the present invention including a molded plastic mounting component, portions thereof broken away.

Referring specifically to FIG. 6, an enlarged cross-sectional view of a completely integrated electro-optical package 70 is illustrated. In the embodiment of FIG. 6, portions that are similar to those described in conjunction with FIGS. 2 and 3 are designated with similar numbers having a double prime added to indicate the different embodiment. A dual sided opto-electronic device 10" is positioned within a molded optically opaque mounting structure 72. In the simplest embodiment, molded mounting structure 72 is a separate component, formed as a carrier ring-like structure of opaque material, such as molded opaque plastic, resin or other material suitable for the purposes stated herein, defining central openings/"windows" therein (not shown) or optically transparent central portions 74 formed so as to be substantially coextensive with the light emitted by dual sided opto-electronic device 10". It should be understood that central portions 74, and/or central openings (not shown) are formed on opposed major surfaces of mounting structure 72.

Mounting structure 72 is formed of molded plastic, more specifically, a substantially opaque, transfer or injection resin, having a coefficient of thermal expansion (CTE) of 15–20 ppm. Mounting structure 72 has formed within one of the central portions 74, a refractive or diffractive lens 76, that is substantially the same size as the array of light emitting devices 12" so that the image generated by light emitting devices 12" in cooperation, is completely visible therethrough, once dual sided opto-electronic device 10" is properly registered on mounting structure 72, utilizing standard bump bonding techniques. The refractive or diffractive lens 76 can be formed by stamping or pressing the lens surface onto the upper major surface of the optically transparent central portion 74, or by injection molding of the lens 76 into a central opening (not shown) or injection molding a transparent substrate in the central opening, and thereafter stamping or pressing the lens surface onto the upper major surface of the substrate. Disclosed in this embodiment are a plurality of electrical conductors 78, each extending from a connection/mounting pad 79 on a plurality of interior major surfaces 80 of mounting structure 72, adjacent an edge of central portion 74, to a plurality of embedded driver substrates 82, positioned within mounting structure 72, to electrically connect the rows and columns of light emitting devices 12" and the at least one VCSEL 16" to a plurality of driver and control circuits 68'. It is additionally disclosed to use surface mounted or embedded leadframes, and or plated through-hole vias to form the required means for electrically connecting the components together. Mounting structure 72, in this specific embodiment, is constructed with a central portion 74 approximately 0.2 inches on a side and an outer periphery of 0.5 inches on a side. Electrical conductors 78 and connection/mounting pads 79 can be formed from surface embedded copper leads, plated through hole vias, solder paste screen print interconnects, gold plated interconnects or metal evaporation. Electro-optical package 70 is electrically interfaced with external components utilizing a plurality of bumps 84 and standard bump bonding techniques, or alternatively any other convenient means for electrically interfacing, well known in the art.

With regard to the embodiments disclosed herein, the driver and control circuits 68 and 68' generally are formed as smaller integrated circuits which are wire bonded or bump bonded to electrical contacts on driver substrates 62, 63 and 82. Driver substrates 62, 63, and 82 are, for example, a convenient printed circuit board, such as FR4 or the like, and have either bumps 65 of contact material, such as C5 solder, solderable plated metal, or the like, or connecting pins (not shown) positioned on a lower major surface thereof, as illustrated in FIG. 4, or embedded into the mounting structure, as illustrated in FIG. 6. In some specific applications, driver substrates 62, 63, and 82 could be single semiconductor chips, having all of the driver and interconnect components integrated thereon.

Bumps 65 (if utilized) and those used in interfacing dual sided opto-electronic device 10, 10', and 10" and mounting structures 52, 52' and 72 (previously discussed) are formed of a material that is a relatively good electrical conductor and which can be at least partially melted and reset to form a good physical connection. Material which can be utilized for this purpose includes gold, copper, solder and especially high temperature solder, conducting epoxy, etc. A bump height of up to 80 microns can be formed on a square or round connection/mounting pad with a 20 micron diameter. For smaller pitches, 5 micron diameter copper bumps with a pitch of 10 microns have been formed with a bump height of 20 microns. Also, 15 micron diameter gold bumps on a 30 micron pitch have been formed to a height of 30 to 45 microns.

The interstice between each of the dual sided opto-electronic devices 10, 10' and 10" and mounting structures 52, 52' and 72, respectively, can be filled with an optically transparent material 69, (shown in FIG. 4), which may be any convenient material to provide support and make electro-optical package 50, 60 and 70 more robust packages. Thus, in the disclosed embodiments, dual sided opto-electronic device 10, 10' and 10" and mounting structures 52, 52' and 72 are not physically attached together and different coefficients of expansion will have little or no effect.

It should be understood that for best results mounting structures 52, 52' and 72 and dual sided opto-electronic device 10, 10', and 10" should be constructed with indices of refraction which are as close together as practical. If, for example, the index of refraction of the mounting structures and the dual sided opto-electronic device differs substantially there is a tendency for light to reflect back from substrate 14 of dual sided opto-electronic device 10 and the efficiency of the electro-optical package is reduced. Generally, an index of refraction of approximately 1.5 for mounting structures 52, 52', and 72 and dual sided opto-electronic device 10, 10', and 10" has been found to be acceptable.

It should be understood that the images generated by the array of light emitting devices 12 and the at least one VCSEL 16 is generally too small to properly perceive (fully understand) with the human eye and generally requires a magnification of at least 10× for comfortable and complete viewing. Therefore, lens 76 can be formed as a single lens with additional optical magnification supplied by an external system or lens 76 in electro-optical package 70 can be formed as a complete magnification system. Several examples of optical magnification systems which may be incorporated into lens 76 or applied externally thereto are described in copending application, Ser. No. 08/405,057 entitled, "A SINGLE FOLD OPTICAL MAGNIFIER FOR USE IN IMAGE MANIFESTATION APPARATUS", filed, Mar. 16, 1995, assigned to the same assignee and incorporated herein by this reference. In addition, further detailed description of the utilization of the electro-optical package and dual sided opto-electronic device of the present invention, incorporated into an electronic device, such as an electronic transceiver, can be found in copending application, filed of equal date herewith, entitled "MULTI FUNCTIONAL PORTABLE ELECTRONIC TRANSCEIVER", assigned to the same assignee, and incorporated herein by this reference.

Thus, the present invention illustrates and teaches integrated electro-optical packages having contained within dual sided opto-electronic devices, composed of arrays of light generating devices and vertical cavity surface emitting lasers (VCSELs) formed on a common substrate element. The mounting structure to which the opto-electronic device is mounted is formed of some optically transparent material or alternatively of a molded transparent and/or opaque material, such as plastic, having formed therein electrical conductors, and/or plated through hole vias. The packages are not limited in size by the electrical connections and optics and are substantially smaller than previous integrated packages which perform the same functions. Also, the present invention illustrates and teaches integrated electro-optical packages in which the mounting structure is formed as a molded component, in combination with optical elements formed therein so as to create a generally monolithic mounting structure and lens component.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating an electro-optical package comprising the steps of:

forming a dual sided opto-electronic device, including a plurality of light emitting devices epitaxially formed on a first major surface of a substrate, each of the plurality of light emitting devices having first and second electrodes for activating the light emitting devices, the light emitting devices defining a plurality of pixels positioned in rows and columns and cooperating to generate a complete image, when activated, at a central portion of the substrate, the substrate further being formed with at least one vertical cavity surface emitting laser (VCSEL) epitaxially formed on an opposed second major surface of the substrate, having first and second electrodes for activating the at least one vertical cavity surface emitting laser at a central portion of the substrate, the dual sides opto-electronic device further having a plurality of connection pads adjacent outer edges thereof and outside of the central portions of the first major surface and the opposed second major surface with the first and second electrodes of the light emitting devices and the first and second electrodes of the at least one vertical cavity surface emitting laser (VCSEL) being connected to a plurality of external connection pads;

forming a mounting structure having a plurality of interior major surfaces for mounting the dual sides opto-electronic device and a means for electrical connection to the dual sided opto-electronic device on the plurality of interior major surfaces of the mounting structure with the means for electrical connection of the mounting structure in electrical contact with the plurality of external connection pads of the dual sides opto-electronic device.

2. A method of fabricating an electro-optical package as claimed in claim 1 further comprised of the steps of:

forming at least one driver substrate having first major surface and a second opposed major surface with a plurality of connection pads formed thereon the first major surface and the second major surface;

forming a plurality of driver and controller circuits having a plurality of data input terminals and further having a plurality of control signal output terminals adapted to be connected to the first and second electrodes of light emitting devices and the at least one vertical cavity surface emitting laser (VCSEL);

mounting the at least one driver substrate on the mounting structure with the plurality of connection pads on the first major surface of the at least one driver substrate in electrical contact with the means for electrical connection of the mounting structure; and mounting the plurality of driver and controller circuits on the second opposed major surface of the at least one driver substrate with the plurality of control signal output terminals electrically contacting the plurality of connection pads on the second opposed major surface of the at least one driver substrate.

3. A method of fabricating an electro-optical package as claimed in claim 2 wherein the step of forming a mounting structure with means for electrical connection includes the step of forming the means for electrical connection with at least one of a plurality of connection pads, a plurality of surface mounted leadframes, a plurality of embedded leadframes, and a plurality of plated through-hole vias.

4. A method of fabricating an electro-optical package as claimed in claim 1 wherein the step of forming a plurality of light emitting devices on the first major surface of the substrate includes forming one of a plurality of organic light emitting diodes, a plurality of inorganic light emitting diodes, a plurality of liquid crystal devices (LCDs), and a plurality of vertical cavity surface emitting lasers on the substrate.

* * * * *